United States Patent [19]

Bentley et al.

[11] Patent Number: 4,796,003
[45] Date of Patent: Jan. 3, 1989

[54] DATA COMPACTION

[75] Inventors: Jon L. Bentley, New Providence; Daniel D. K. Sleator, Summit; Robert E. Tarjan, Oldwick, all of N.J.

[73] Assignee: American Telephone and Telegraph Company, Murray Hill, N.J.

[21] Appl. No.: 625,630

[22] Filed: Jun. 28, 1984

[51] Int. Cl.⁴ .......................... G06F 3/00; H04N 1/00
[52] U.S. Cl. ........................................ 341/95; 358/260
[58] Field of Search ................ 340/347 DD; 358/260, 358/261

[56] References Cited

U.S. PATENT DOCUMENTS

| | | | |
|---|---|---|---|
| 3,717,851 | 2/1972 | Cocke | 375/122 |
| 4,107,457 | 8/1978 | Hajduk | 178/17.5 |
| 4,121,259 | 10/1978 | Preuss et al. | 340/347 DD |
| 4,168,513 | 9/1979 | Hains et al. | 340/347 DD |
| 4,319,225 | 3/1982 | Klose | 340/347 DD |
| 4,396,906 | 8/1983 | Weaver | 340/347 DD |
| 4,446,516 | 5/1984 | Nishimura | 340/347 DD |
| 4,447,676 | 5/1984 | Harris et al. | 179/90 SD |
| 4,464,650 | 8/1984 | Eastman et al. | 340/347 DD |
| 4,612,532 | 9/1986 | Bacon et al. | 340/347 DD |

Primary Examiner—Bernard Roskoski
Attorney, Agent, or Firm—Robert O. Nimtz; Jerry W. Herndon

[57] ABSTRACT

An algorithm or technique for compacting (and expanding) digital data is disclosed in which the data is broken up into words or lexemes. The words are entered into a push-down list as they are received and, if already on the list, a list location identifier is transmitted and the word moved to the top of the list. The last word on the list falls off the list when a new word is entered at the top and thereafter is treated as a new word. The data expander maintains identical lists and substitutes the data word for the list location code when received. Both hardware and software implementations are disclosed.

12 Claims, 2 Drawing Sheets

DATA COMPACTOR

DATA EXPANDOR

DATA COMPACTION

TECHNICAL FIELD

This invention relates to digital data processing systems and, more particularly, to data compaction in digital transmission or digital storage systems.

BACKGROUND OF THE INVENTION

The growing use of computer-processed data base information systems has increased the use of digital storage and digital transmission systems by a large factor. Moreover, such use will undoubtedly increase even faster in the future as the information age unfolds. Any reduction, therefore, in the amount of secondary storage facilities or in the bandwidth of the transmission facilities required for this increased information usage will have significant economic effects.

Much stored or transmitted data is redundant. The English language, for example, or a programming language, includes "words" which are often reused. One type of coding which takes advantage of this redundancy is the so-called Huffman code, described in "A Method for the Construction of Minimum Redundancy Codes," by D. A. Huffman, 40 *Proc. IRE* 1098, September, 1952. In the Huffman scheme, variable length code words are used, the length of the code word being related to the frequency of occurrence of the encoded symbol. Unfortunately, the Huffman approach requires two passes over the data, one to establish the frequency of occurrence of the symbols and another to do the actual encoding. Moreover, the Huffman technique requires temporary storage for the entire data block while the first pass is taken, as well as incurring a corresponding time delay.

SUMMARY OF THE INVENTION

In accordance with the illustrative embodiment of the present invention, the advantages of Huffman encoding are retained while all of the major disadvantages are avoided. More specifically, the present invention compresses data with a compaction factor comparable to Huffman coding, but with a one pass procedure.

More particularly, a system and an algorithm are used in which a word list is maintained with the position of each word on the word list being encoded in a variable length code, the shortest code representing the beginning of the list. When a word is to be transmitted (or stored), the list is scanned for the word. If the word is on the list, the variable length code representing the word list position is sent instead of the word itself and the word moved to the head of the word list. If the word is *not* on the word list, the word itself is transmitted (or stored), and then that word is moved to the head of the word list (while all other words on the word list maintain their relative order).

The receiver (or retriever from storage) decodes the data by repeating the same actions performed by the transmitter (or the storing mechanism). That is, a word list is constructed and the variable length codes used to recover the proper words from the word list.

In the scheme of the present invention, the most often used words will automatically congregate near the front of the word list and hence be transmitted or stored with the smallest number of bits.

In accordance with a feature of the present invention, arbitrary prefix codes can be used to transmit word positions on the list, low positions being encoded with the shortest codewords. So too can list organization heuristics be varied such as, for example, by moving the selected word ahead a fixed number of places or transposing it one position forward.

In accordance with another feature of the invention, the word list can be of finite or (for all practical purposes) infinite length. With a finite length word list, once words are shifted off the end of the list, they are treated as new words when seen again.

In accordance with yet another feature of the invention, the list positions themselves can be treated as new input data and the compaction scheme applied recursively to its own output, creating a new list and new variable length codes.

DETAILED DESCRIPTION

Figure 1:
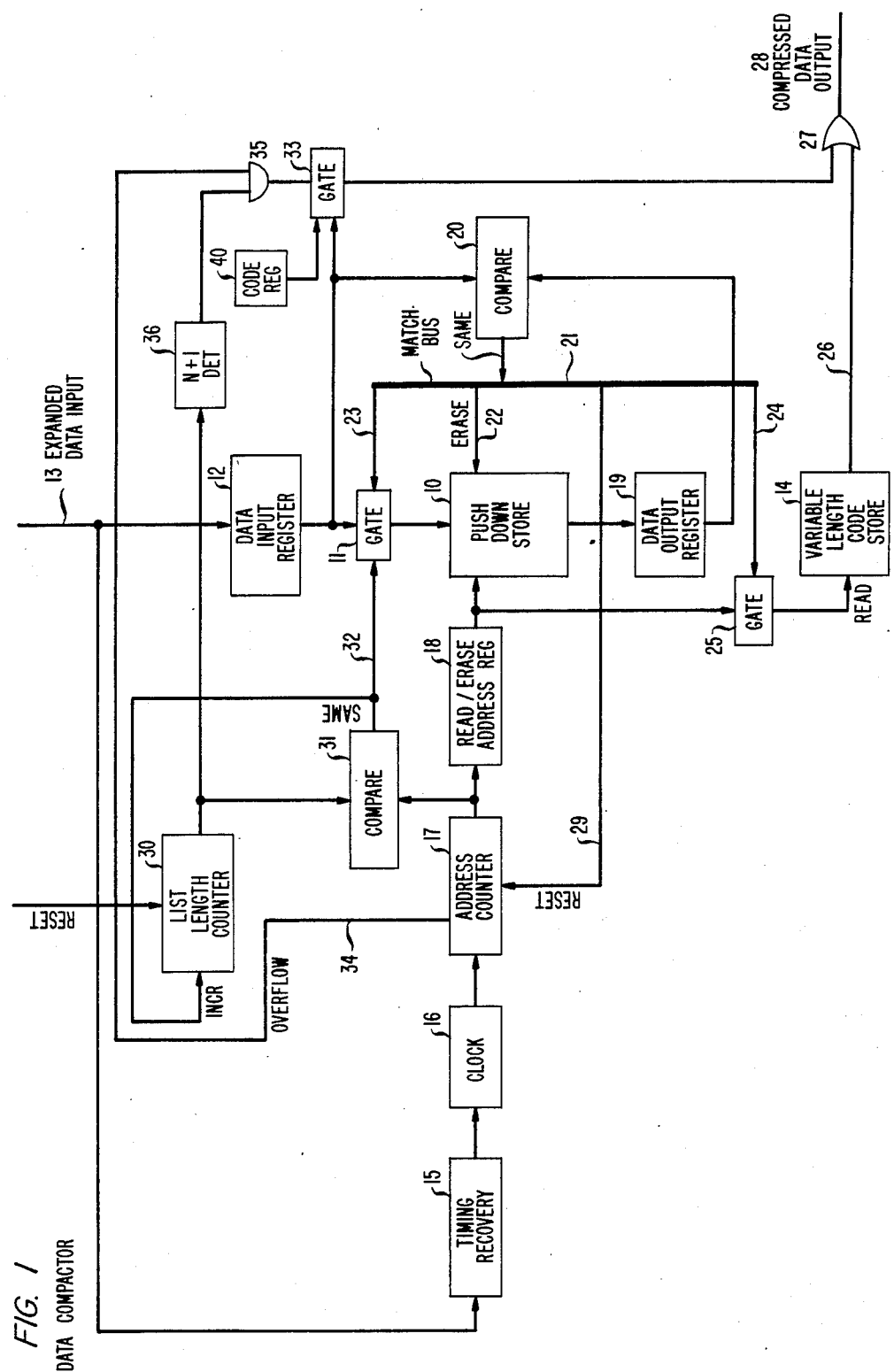
FIG. 1 is a detailed block diagram of a data compactor system in accordance with the present invention.

Referring more particularly to FIG. 1, there is shown a detailed block diagram of a hardware implementation of a data compacting system in accordance with the present invention. The system of FIG. 1 may comprise a portion of the transmitter in a data transmission system in which it is desired to reduce the required bandwidth of the digital signal in order to take advantage of low bandwidth transmission lines or to permit multiplexing a larger number of separate digital signals on a wide bandwidth transmission line. The system of FIG. 1 may also comprise a portion of a data storage system in which it is desired to reduce the amount of storage required for digital data signals to be stored in the data storage system.

Before proceeding to a description of FIG. 1, it is important to properly understand the concept of "word" as used in the present application. Many forms of digital data represent highly redundant information. Typical examples are text in any natural language, text representing computer programs, encoded samples of speech or video information, and so forth. The object of the present invention is to compact the digital data by taking advantage of these natural redundancies in the digital data.

In order to derive maximal advantage from the compacting scheme of the present invention, the incoming digital data stream must be partitioned into packets, conveniently called "words", which tend to possess the maximum redundancy. In English text, for example, white space can be used to divide the data into English words which are highly redundant. Computer programs can be similarly partitioned into tokens using punctuation and white space as the natural separators. This process of partitioning the data stream into "words" is called lexical analysis and the resulting digital packets are called "lexemes". Such processes are well-known and are found universally in computer program compilers and assemblers, as well as in most word processing packages. Some data streams, such as encoded voice, are already divided into highly redundant samples and need to further lexical analysis.

The result of the partitioning process (the lexemes) will hereafter be termed "words" even though the packets may have no relationship to English language words. Such words may be of uniform length or of variable length, depending on the type of lexical analysis employed. In any event, however, the process is selected to maximize the amount of redundancy in the words, based on whatever foreknowledge of the data stream is available.

The data compaction system of FIG. 1 comprises a push-down store 10 adapted to store a fixed plurality N of data words. Words are entered at the top of push-down store 10 and, in the process of entering a new word at the top of the list, all other words in store 10 are pushed down one storage position. Words enter into push-down store 10 via gate 11 from data input register 12. Data input register 12, in turn, receives data input words from data input line 13 in series or in parallel. The data on input line 13 is the partitioned data which is to be compacted by the system of FIG. 1.

The data compaction system of FIG. 1 also includes a variable length code store 14 having the same number N of word positions as push-down store 10, but in which each permanent entry is a unique word of variable length having the properties of being uniquely identifiable and having an average length shorter than the average length of the words in push-down store 10. The code store 14 can be most easily implemented by a read-only memory (ROM) in which one code word is stored at each of the uniquely addressable locations. The overall function of the compaction system of FIG. 1 is to substitute the shorter words in code store 14 for the most-often occurring longer words in push-down store 10. For simplicity, the system of FIG. 1 will be described in connection with fixed length input data words (encoded speech, for example). The modifications necessary to handle variable length input will be obvious to those skilled in the art.

The system of FIG. 1 includes a timing recovery circuit 15 which recovers the bit timing rate from the data words on input line 13 and uses this timing information to drive a clock source 16 which generates clock pulses at a rate $N \times r$, where N is the number of word positions in stores 10 and 14, and r is the word rate of data words appearing on input line 13.

Clock pulses from clock pulse source 16 drive an address counter 17 which sequentially generates the addresses of the data word positions in push-down store 10. As each of these addresses is generated, it is stored in an address register 18 from which it is available to access the identified word position in push-down store 10, either to read the word at that storage position, or to encode the word at the storage position. Data words read from push-down store 10 by the address in address register 18 are temporarily stored in data output register 19 from which they are applied to a word comparison circuit 20. The word in data input register 12 is applied to the other compare input of compare circuit 20.

When the words in data output register 19 and data input register 12 match, an output is produced from compare circuit 20 on match bus 21. This signal on match bus 21 performs several functions. First, it erases the word at the current storage position in push-down store 10 via line 22. This word position is, of course, the address in address register 18 at the time the match occurs and hence is the word position in push-down store 10 of the data word which mathces the data word in input register 12. Simultaneously, the signal on lead 23 operates gate 11 to enter the data word in register 12 into the top of the push-down store 10, pushing all other words down one storage position until an empty storage position is filled. If no storage positions are empty, the data word in the last or bottom storage position is lost. One technique for accomplishing this end is to make the empty storage position temporarily look like the tail of the push-down list.

When a match signal appears on bus 21, it is also applied via lead 24 to operate gate 25 to transfer the address in address register 18 to variable length code store 14. This addresses causes the variable length code at the identified address in store 14 to be read out onto leads 26 and through OR gates 27 to data output line 28. This variable length code from code store 14 is thus substituted for the fixed length data word in push-down code 10. Since the variable length codes in store 24 are significantly shorter, on the average, than the full length words in push-down store 10, the output data stream on line 28 is significantly shorter than it would have been if the full length input words on line 13 were not compacted.

The match signal on bus 21 is also applied via lead 29 to reset address counter 17 to the address of the first position in push-down store 10. Thus address counter 17 is put in a condition to start the next cycle for the next input word to input register 12.

A list length counter 30 is provided to keep track of the length of the word list in push-down store 10 when store 10 is not completely filled. The addresses in counter 30 are applied to one compare input of compare circuit 31 while the contents of address counter 17 are applied to the other compare input of compare circuit 31. When a match occurs, a signal on match output lead 32 increments counter 30, operates gate 11 to enter the word in input register 12 onto the top of push-down store 10. If counter 30 reaches a count of $(N+1)$ indicating that store 10 is full, the next input data word which does not cause a match in compare circuit 20 causes address counter 17 to recycle at count N. An overflow signal from counter 17 on lead 34 is combined in AND gate 35 with the output of $(N+1)$ detection circuit 36 to operate gate 33 and apply the contents of input register 12 or OR gates 27 and thence to output line 28.

Since the reciver (or data retriever) can only uniquely identify the prefix codes which it receives, it is necessary to reserve one prefix code as a flag to indicate that the following data is a new word rather than a prefix code. This reserved code is chosen from the set of reserved codes and used only to signal new data words and thus does not represent any storage position in push-down store 10. This reserved prefix code is transmitted to output line 28 just before the data word. Thus, when AND gate 35 is fully enabled, the contents of prefix code register 40 is transferred to OR gates 27 along with the contents of input register 12.

It can be seen that the system of FIG. 1 operates to maintain a running list of data words received on input line 13. The most repeated input words tend to be near the top of the push-down list in store 10 simply because they are moved to the top each time they appear. Data input words which occur less often in the input stream, even though they are put at the top of the list initially, are soon pushed towards the bottom by the arrival of the more often-repeated words.

It will be noted that the compaction factor is maximum if the shortest variable length code in store 14 corresponds to the first storage position in push-down store 10, and if the length of the codes in store 14 increases monotonically from the first storage position to the last. It will also be noted that, if the length of push-down store 10 is equal to or longer than the number of unique input words on line 13, the system of FIG. 1 becomes a simple code converter which converts each input data word to a shorter code word, thus maximizing the compaction factor. Indeed, incrementally increasing the length of store 10 (and concurrently store 14) provides a simple mechanism for trading off compaction hardware cost and transmission or storage cost savings to obtain the economically optimum overall data system.

It will be further appreciated that further compaction is possible simply by treating the output on output line 28 as the input to yet another compaction system similar to the compaction system of FIG. 1. Such a cascade of compaction circuits can be extended until the improvement in compaction factor goes to zero or to some desirable minimum. It will be noted that all of the circuits of FIG. 1 can be easily integrated such that the entire data compactor can be readily fabricated on a single integrated circuit chip or, indeed, on a small fraction of the larger integrated circuit chips.

The variable length code in code store 14 can be any of the well-known arbitrary prefix codes such as the efficiently encoded integers disclosed in "Universal Codeword Sets and Representatives of the Integers" by Peter Elias, *IEEE Trans. on Information Theory*, Vol. IT-21, No. 2, March, 1975, pp. 194-203. The shortest code words are always placed at the top of the store 14. As a simplification, the code store 14 can be omitted and the address from address register 18 itself transmitted as the compacted code provided this address is shorter than the data words. Since this is usually the case, such address transmission is possible in many practical systems.

Figure 2:
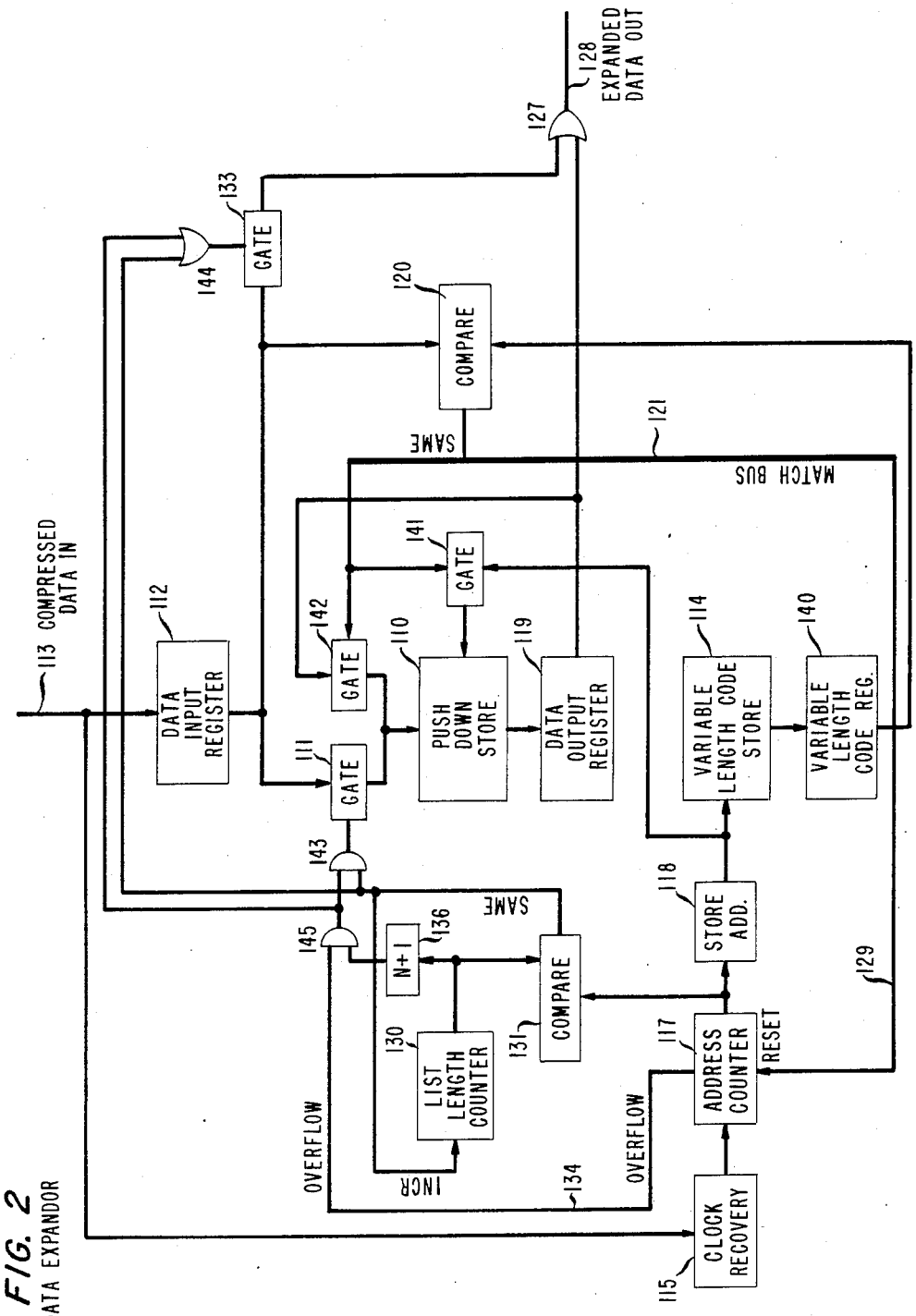
FIG. 2 is a detailed block diagram of a data expander system in accordance with the present invention suitable for expanding the data compacted by the data compactor of the system of FIG. 1.

In FIG. 2 there is shown a detailed block diagram of a data expandor system which expands the data received from the system of FIG. 1 into the original set of data words. The expandor of FIG. 2 may be at the receiving end of a data transmission system of limited bandwidth, or in the data retrieval portion of a data storage system.

The data expandor system of FIG. 2 is the inverse of the data compactor of FIG. 1 and utilizes many of the same or similar elements. Thus the data expandor of FIG. 2 is comprised of a push-down store 110 and a variable length code store 114 of a length equal to the corresponding elements of FIG. 1. The bit rate of the input digital stream on line 113 is recovered a clock recovery circuit 115 and used to drive an address counter 117. The address codes generated by counter 117 are temporarily stored in address register 118 which is used to access variable length code store 114 rather than push-down store 110. A variable length code register 140 temporarily stores the variable length code addressed by the address code in address register 118.

Data received on input line 113 is stored in data input register 112 and compared in compare circuit 120 to the contents of code register 140. If a match occurs, a signal on match bus 121 operates gate 141 to apply the address in address register 118 to the push-down store 110. This address signal destructively reads the data word in push-down store 110 at this address into data output register 119. The storage position in store 110 which this data word occupied is left empty while the data word is applied from output register 119 through OR gates 127 to output line 128.

The match signal on bus 121 simultaneously operates gate 142 to place the data word in register 119 at the top of the push-down store 110. The match signal on bus 121 also resets counter 117 via lead 129.

A list length counter 130 maintains a count of the number of data words stored in push-down store 110. Its contents are compared in compare circuit 131 to the contents of address counter 117 and, when a match occurs, counter 130 is incremented by one. Simultaneously, the data word from data input register 112 is gated into push-down store 110 via OR gate 143 and gate 111. The contents of input data register 112 is also gated via OR gate 144 and gate 133 to OR gate 127 and thence to output line 128. When push-down store 110 is full, list length counter 130 is incremented to (N+1), enabling detector 136. When counter 117 recycles, an overflow signal on lead 134 fully enables AND gate 145 to operate gates 111 and 133 via OR gates 143 and 144, respectively. Thus, new data words arriving in data input register 112 are simultaneously put at the top of the push-down store 110 and sent to the data output line 128.

The data expandor system of FIG. 2 serves to restore the data stream to its full expanded form, matching the data input stream on line 13 of FIG. 1.

The algorithm described above in connection with the hardware implementation of FIGS. 1 and 2 can also be implemented in software. Thus, in Table 1 there is shown a high level pseudo-code computer program for implementing the data compaction portion of the algorithm.

TABLE 1

```
main procedure - compact
    declare:    array words(I, N)
                array codes(I, N + 1)
    initialize: load words(I, N) with nulls
                load codes(I, N + 1) with prefix codes
    while there is input, do
        { temp = next input word
          loc = 1
          while loc ≦ N and words(loc) ≠ temp
              {loc = loc + 1}
          send codes(loc)
          if loc > N
              {loc = N
               send temp}
          for i=loc down to 2
              {word(i) = word(i-1)
               word(1) = temp}
        }
end
```

Similarly, in Table 2 there is shown a pseudo-code computer program for implementing the expandor algorithm.

TABLE 2

```
main procedure - expand
    declare:    array words(I, N)
                array codes(I, N + 1)
    initialize: load words(I, N) with nulls
                load codes(I, N + 1) with prefix codes
    while there is input, do
        { temp = next input code
          loc = 1
          while codes(loc) ≠ temp
              {loc = loc +1}
          send word(loc)
          if loc > N
              {loc = N
               temp = next input word
```

TABLE 2-continued

```
            send temp}
    for i=loc down to 2
        {word(i) = word(i-1)
         word(1) = temp}
   }
end
```

In both cases, two arrays are used, words and codes. The array words is the push-down list while the array codes is the code store. The operation of the algorithm is obvious from inspection and is directly parallel the operation of the hardware embodiment of FIGS. 1 and 2.

What is claimed is:

1. A system for compacting a sequence of multicharacter data words, comprising:
   input means for receiving said sequence of words,
   means for outputting a compacted sequence of said words,
   a single fixed length push-down storage means,
   means for determining in order if each word of the sequence is presently stored in the push-down storage means,
   means responsive to the determining means for generating a location code corresponding to the present address, if any, of a word in the push-down storage means,
   means for placing each word of said sequence nearer to the top of said push-down storage means than its present location, if any, in the push-down storage means, and
   means for substituting for a word in the outputted character sequence a said generated location code, wherein the location code contains less characters on average than the corresponding data word.

2. The system according to claim 1 comprising a digital computer and a computer program.

3. The system according to claim 1 or 2 wherein said location codes comprise arbitrary prefix codes.

4. The system according to claim 1 or 2 wherein said location codes comprises fixed length addresses.

5. The system according to claim 1 wherein said push-down storage means comprises means for placing said each new word at the top of said push-down storage means.

6. The system of claim 1 wherein
   the location code generating means further comprises random access storage means for storing the location codes at addresses thereof corresponding to the storage addresses of the corresponding words in the push-down storage means.

7. The method of compacting a stream of digital data bits comprising the steps of
   partitioning said stream into a plurality of lexemes,
   storing each lexeme in a first-in, first-out list nearer to the top of said list than its present position, if any, in the list, and
   for each lexeme already on the list, substituting a location code for the lexeme, wherein the length of the location codes are on average less than the length of the lexemes, or selecting the lexeme itself for lexemes not on said list, for further utilization.

8. The method of claim 7 as performed in special purpose circuit hardware.

9. The method of claim 7 as performed in a programmed digital computer.

10. The method of claims 7, 8 or 9 further comprising the step of
    establishing variable length arbitrary prefix codes as said location codes.

11. The method of claims 7, 8 or 9 further comprising the step of
    establishing fixed length location codes.

12. The method of claim 7 further comprising the steps of
    moving each lexeme already on said list to the top of said list, and
    entering new lexemes at the top of said list.

* * * * *